United States Patent
Turco

[11] Patent Number: 5,381,423
[45] Date of Patent: Jan. 10, 1995

[54] PROCESS AND DEVICE FOR THE DECODING OF A SHORTENED, CYCLIC BINARY CODE USING ERROR CORRECTION

[75] Inventor: Ermanno Turco, Milan, Italy

[73] Assignee: Italtel Societa Italiana Telecomunicazioni S.P.A., Milan, Italy

[21] Appl. No.: 176,680

[22] Filed: Jan. 3, 1994

Related U.S. Application Data

[63] Continuation of Ser. No. 778,919, Feb. 24, 1992, abandoned.

[30] Foreign Application Priority Data

Jul. 25, 1989 [IT] Italy ............................. 21288 A/89

[51] Int. Cl.⁶ .................. G06F 11/10; H03M 13/00
[52] U.S. Cl. ........................ 371/39.1; 371/45; 371/38.1
[58] Field of Search ............. 371/39.1, 38.1, 37.7, 371/37.3, 37.2, 37.4, 37.8, 44, 45, 40.2, 41, 37.1, 30

[56] References Cited

U.S. PATENT DOCUMENTS

| | | | |
|---|---|---|---|
| 3,278,729 | 10/1966 | Chien | 371/39.1 |
| 3,568,148 | 3/1971 | Clark | 371/39.1 |
| 3,648,238 | 3/1972 | Yarrington | 371/39.1 |
| 3,801,955 | 4/1974 | Howell | 340/146.1 AL |
| 4,059,825 | 11/1977 | Greene | 371/39.1 |
| 4,382,300 | 5/1983 | Crupta | 371/41 |
| 4,677,623 | 6/1987 | Iwasaki et al. | 371/39.1 |
| 4,698,813 | 10/1987 | Erdel | 371/39.1 |
| 5,297,153 | 3/1994 | Baggen et al. | 371/37.1 |

OTHER PUBLICATIONS

IBM Technical Disclosure Bulletin, vol. 30, No. 5, Oct. 1987, pp. 41–44.
IEEE Transactions on Information Theory, vol. 15, No. 1, Jan. 1969, pp. 109–113.
IBM Technical Disclosure Bulletin, vol. 31, No. 7, Dec. 1988, pp. 332–335.

*Primary Examiner*—Robert W. Beausoliel, Jr.
*Assistant Examiner*—Dieu-Minh Le

[57] ABSTRACT

Process and device to decode a shortened cyclic binary code, able to correct single errors bursts of given length t or shorter, specially for an F(n−b,k−b) shortened Fire code. It is based on the calculation of two syndrome polynomials, s1(x) and s2(x), in two specific registers (SR1, SR2), on the shifting in a first direction of the polynomial s1(x) Γ1 times until the errors burst is trapped in the t less significant positions of the first (SR1) register and on the shifting of the syndrome polynomial s2(x) Γ2 times in an opposite second directon in a third (MEL) register until it becomes equal to the t less significant positions of the first (SR1) register. Alternatively the second register can be a bidirectional shift register (SRb) where the shifting takes place also in the second direction. Moreover all computations in the process are made as simple as possible.

16 Claims, 2 Drawing Sheets

PROCESS AND DEVICE FOR THE DECODING OF A SHORTENED, CYCLIC BINARY CODE USING ERROR CORRECTION

This application is a continuation of application Ser. No. 07/778,919 filed on Feb. 24, 1992, now abandoned.

FIELD OF THE INVENTION

This invention concerns the decoding of a binary code able to correct error bursts, and, more precisely, a process for the decoding of a cyclic shortened binary Fire code. Moreover this invention relates to a decoding device that tests the presence of such errors and corrects an decodes the received code word.

BACKGROUND OF THE INVENTION

The rate of digital transmission is getting faster. Errors arising in the transmission channel, due to disturbances such as noise, fading, interferences, and so forth, make the transmission unreliable. Therefore, several techniques are used for the automatic correction of such errors on reception.

This is usually achieved by protecting the information to be sent by means of error correction codes. Considering such information as being divided in words of k bits each, the block code (n,k) follows a relationship law coupling each word of information to a n bit long code with n>k. The n−k difference is called redundancy.

Cyclic codes are class of such kind of codes, where all the words in the code can be obtained starting from a word in the code means by a processes of cyclic shifting.

It is helpful to use polynomials to represent both the information and the code words. So, the information word, a k-tuple $(i_0, i_1, \ldots i_{k-1})$, will be represented by the polynomial $i_0 + i_1 x + \ldots + i_{k-1} x^{k-1} = i(x)$, and the code word, an n-tuple $(c_0, c_1 \ldots c_{n-1})$, will be represented by $c_0 + c_1 x + \ldots + c_{n-1} x^{n-1} = c(x)$. The law of coding itself can be represented by a g(x) polynomial of degree (n−k), the so-called generator, such that the code polynomial c(x) is obtained multiplying the g(x) polynomial by the polynomial i(x). An important class of such codes, able to contrast error bursts that are typical in memory channels (like radio channels affected by fading) is the class of the so-called Fire codes with GF(2), the above notation representing double value (0 and 1) Galois fields. The generator polynomial of such kind of codes can be expressed in a general form by:

$$g(x) = (x^{2t-1} - 1) p(x) \qquad (1)$$

where p(x) is a m degree irreducible polynomial.

Let ro be the period of p(x), i.e. the smallest integer such that p(x) divides $(x^{ro}+1)$ and t a positive integer, smaller or equal to m, such that (2t−1) is not divisible by ro.

The code length (the number of bits in each code word) is the least common multiple of (2t−1) and ro, and the number of redundant bits is (m+2t−1).

Below, the Fire codes are represented by the notation F(n,k), where n indicates the length of the coded word, k is the length of the information word and (n−k) is the redundancy.

A code with generator polynomial g(x) given by (1), for which the above conditions expressed or m, ro and (2t−1) are verified, is able to correct any single error burst (i.e. the sequence of bits included between the first and the last erroneous bit in the code word) shorter or equal to t, and also to detect the presence of error bursts longer than t.

Fire codes can be decoded using decoders belong to the family of "Error Trapping" decoders. In such devices, the time required for correcting the errors is equal to n cycles, n being the length of the code word.

In technical literature, there are some known decoders studied "ad hoc" for the Fire codes, able to correct errors in a shorter time. Once of such devices is discussed in IBM Technical Disclosure Bulletin, Vol. 30 No. 5 October 1987. This article describes a traditional Fire-Code Decoding technique in which the received code word is considered as a single polynomial from which a single syndrome is computed by shifting in one direction and an error correction is accomplished by shifting in the reverse direction. Another of such devices has been proposed by R. T. Chien in his paper "Burst-correcting codes with high-speed decoding", IEEE Trans. on Information Theory, Vol. IT-15, Nr. 1, January 1969, pages 109 to 113.

This document discloses a process for the decoding of a shortened cyclic binary code, able to correct single error bursts b(x) of given length t or shorter, specifically a F(n−b, k−b) shortened Fire code, with generator polynomial $g(x) = (x^{2t-1}+1).p(x)$, p(x) being a prime polynomial over GF(2) with period ro, satisfying the ro>(n−b), condition, where:

the received code word r(x) is buffered in a shift register as a received vector and the syndrome polynomials s1(x) and s2(x) are calculated in (n−b) cycles;

the polynomial s1(x) is cyclic shifted a Γ1 number of times in a first direction until all zeros are obtained in the (t−1) higher order positions, so to trap the burst b(x) of length t in the lowest order positions.

Once the code word has been inputted, Chien's decoder can correct errors in a number of cycles (this being the delay with which the correct code can be obtained) given at most by:

$$(2t-2) + (ro-1) \qquad (2)$$

As for a Fire code, n is the least common multiple of (2t−1) and ro, and as (2t−1) is not divisible by ro, n can at most be equal to ro.(2t−1).

A normal "Error Trapping" decoder would at most take ro.(2t−1) cycles to correct errors. Such value is much larger than the one given by expression (2), and this justifies the given definition for Chien's device as a high speed one.

The basic idea in Chien's decoder is that of using as syndrome a couple of polynomials, s1(x) and s2(x), where s1(x) is the remainder polynomial obtained by dividing the received polynomial r(x) by the factor $(x^{2t-1}+1)$ in the generator polynomial, and s2(x) is the remainder polynomial obtained by dividing the received polynomial r(x) by the factor p(x) in the generator polynomial r(x) by the factor p(x) in the generator polynomial. Above we have used r(x) to represented the received code word that, eventually contains errors.

Chien's decoder basically consists of two loop back shift registers. Both are fed by the bit sequence received in each generic code word. The first register, called "Error Pattern Register", consists of (2t−1) stages and is used to compute the polynomial s1(x), The second Register, called "Error Location Register", consists of $(2t-1)$ stages and is used to compute the polynomial $s1(x)$. The second Register, called "Error Location Register" consists of m stages, and is used to calculate the polynomial $s2(x)$.

If both the polynomials $s1(x)$ and $s2(x)$ are null polynomials, no correction is applied, and the device only performs the decoding of the received code word which is error free.

If just one of the two polynomials $s1(x)$ and $s2(x)$ is not a null polynomial, then the device does not decode but detects the presence of errors (the error burst being greater than t).

Finally, if both polynomials $s1(x)$ and $s2(x)$ are not null polynomials, then the error correction process is started, at the end of which the decoding is performed (for error bursts of length $<=t$).

The correction algorithm is accomplished in four phases:

Phase 1

$s1(x)$ is shifted $\Gamma1$ times in the Error Pattern Register to obtain all zeros in the most significant $(t-1)$ positions. The remaining t positions will be occupied by the components of the polynomial $b(x)$ of degree $(t-1)$. The polynomial $b(x)$ represents, unless an integer number of shifts, the burst to be corrected.

Phase 2.

$s2(x)$ is shifted $\Gamma2$ times into the Error Location Register until the polynomial $b(x)$ is obtained in the less significant t positions.

Phase 3

There is only one integer q that, when divided by ro and by $(2t-1)$ gives respectively $\Gamma1$ and $\Gamma2$. The value of q can be calculated using the formula:

$$q = \Gamma1.A2.ro + \Gamma2.A1.(2t-1) \bmod(n) \qquad (3)$$

A1 and A2 being integers that satisfy the condition:

$$A1.(2t-1) + A2.ro = 1 \qquad (4)$$

Phase 4

The polynomial $x^{(n-q)}.b(x)$ is the error burst to be corrected.

The correction is performed by adding modulo 2, the polynomial $x^{(n-q)}.b(x)$ to the received polynomial $r(x)$.

As previously mentioned, the length of a Fire code can be given at most by the expression:

$$n = (2^m - 1).(2t-1) \qquad (5)$$

which is verified if ro and $(2t-1)$ are prime to each other.

The formula (5) clearly shows that by an increase of t, m being $\geq t$, the length of the code increases at least of a factor equal to $2^m$. For instance, a Fire code with m=t that corrects 10 bits bursts (t=10) is 19437 bits long.

It is well known that to obtain smaller words, the code can be shortened by subtracting b bits from both the information word and its related code word. As a result a code $(n-b, k-b)$ is obtained. The structural properties of such code will be the same as the initial code.

In the following, we shall indicate with $F(N=n-b, K=k-b)$ a shortened Fire code, obtained by subtracting b bits to the information word, and the same amount of bits to the word in the code $(F(n,k))$.

As an example, let consider the shortened code $F(224, 182)$ with t=12 specified by ETSI/GSM (Groupe Special Mobile), defined by the following generator polynomial:

$$g(x) = (x^{23} + 1) \cdot (x^{17} + x^3 + 1) \qquad (6)$$

For this code: ro=131071, and n=3014633.

It is exactly in such cases that a shortened code becomes interesting. Further, in order not to handle words of bit length, it is useful to use large values for the b factor. The result of such shortening operation can lead to a $N=n-b$ value smaller than ro, like in the example shown in (6), where N is $<<$ro.

Let assume the following working hypotesis:
p(x) primitive on GF(2);
ro and $(2t-1)$ prime to each other;
$N=n-b<$ro, and preferably $<$ro/2.

If the Chien device is used for decoding and correcting errors, the above mentioned working conditions shall not influence the calculation of $s1(x)$ and $s2(x)$, so the correction algorithm for the error burst starts when the polynomials $s1(x)$ and $s2(x)$ are not null. Moreover as far as the computation of $\Gamma1$ is concerned, there are no comments to do.

But the calculation of $\Gamma2$ belongs to a different case, where we can observe that:

a) As the word in the shortened code is of length N, the constraint $n-q<N$ applies to the generic component of the polynomial representing the received code word and to the burst $x^{n-q}b(x)$ to be corrected.

b) For $n-q=ro-1$, $\Gamma2=1$, for $n-q=ro-2$ it is $\Gamma2=2$, ... for $n=q=ro-k$ it is $\Gamma2=k$.

c) Being $N \leq ro$, let be $D=ro-N$, the constraint on $(n-q)$ in item a) becomes $n-q \leq ro-D-1$.

d) The constraint on $n-q$ in item c), because of the remarks performed in item b), causes a constraint for $\Gamma2$.
This is $\Gamma2 \geq D+1$.

e) the shift Register "Error Locator" is a sequential machine, reaching the state at which is $\Gamma2=D+1$ only after the state transitions with $\Gamma2=1, \Gamma2=2, \ldots \Gamma2=D+1$. So, the burst $x^{N-1}b(x)$, being $(n-q=N-1)$, is corrected after $D+1$ cycles, and the burst $x^{N-\tau}b(x)$, being $(n-q=N-\tau)$, is corrected after $D+\tau$ cycles. Therefore, even if there is a considerable shortening of the code length, Chien's decoder still takes at least $(ro-N+1)$ stages to correct the errors, making it useless to handle a shortened code. Coming back to the above mentioned example concerning ETSI/GSM, even if the code has a length n=224, the error correction process would consist of at least $(ro-N+1)=130848$ cycles.

Furthermore, the error correction process proposed by Chien requires the computing of an expression similar to (3), which contains six multiplications and one sum, and must, therefore, be implemented by a dedicated real time fast logic, or by means of a quite extended memory table to supply precalculated values of q for each $\Gamma1$ and $\Gamma2$ couple.

OBJECTS OF THE PRESENT INVENTION

Therefore, one of the objects of the present invention is to avoid the limitations shown above in the already known decoding technique, and specially, to decrease considerably the correction delay in the decoding of shortened Fire codes.

Another object of the present invention is, to create a faster decoding device working with shortened Fire codes than the ones using the previous technique.

Another object, of the present invention is to simplify computation in the error correction process.

SUMMARY OF THE INVENTION

All these objects are achieved using the present invention, which includes a process for decoding a shortened cyclic binary code, which is able to correct single error bursts $b(x)$ of given length t or shorter, and specially of a shortened $F(n-b,k-b)$ Fire code, with generator polynomial $g(x)=(x^{2t-1}+1).p(x)$, where $p(x)$ is a prime polynomial over $GF(2)$, and having period ro, satisfying the condition $ro>(n-b)$, in which:

- the received $r(x)$ code word is stored and the $s1(x)$ and $s2(x)$ syndrome polynomials are calculated in $(n-b)$ cycles;
- the $s1(x)$ polynomial is cyclically shifted a $\Gamma 1$ number of times in a first direction until all zeros are obtained in the $t-1$ positions of the higher order so to trap the burst $b(x)$ of length t in the lower order positions;

this procedure is characterized by:

- shifting of the remainder polynomial $s2(x)$, in an opposite direction to the above mentioned first one, until the pattern of the t bits of the lowest order becomes the same as that of the already mentioned burst $b(x)$ of length t, and to calculate a $\Gamma 2$ number equal to $(ro-h)$, where h is the amount of shift operations performed;
- calculate $(n-q)$ by the relation:

$$q = \Gamma 1.A2.ro + \Gamma 2.A1.(2t-1) \mod(n)$$

where A1 and A2 are two positive integers such that:

$$A1.(2t-1)+A2.ro=1;$$

perform the correction adding modulo 2 the polynomial $(x^{n-q}).b(x)$ to the received vector.

The present invention also includes a process for the decoding of a shortened cyclic binary code, able to correct single error bursts $b(x)$ of stated length t or less, in particular of a shortened Fire code $F(n-b,n-k)$ having a generator polynomial $g(x)=(x^{2t-1}+1).p(x)$, wherein $p(x)$ is a prime polynomial over $GF(2)$ and having period ro, in which, by means of cyclic shift operations, the $\Gamma 2$ number is calculated equal to $(ro-h)$, with h given by the number of shifts occurred to trap the error burst $b(x)$ in the t less significant positions of the syndrome polynomial $s2(x)$. This process being characterized by the fact of calculating $(n-q)$ by the relation:

$$n-q=\Gamma 2+1-ro$$

and to perform the correction adding modulo 2 the polynomial $(x^{n-q}).b(x)$ to the received vector.

Moreover, the invention also includes a decoding device for shortened cyclic binary codes, particularly a $F(n-b,k-b)$ shortened code, having a generator polynomial in the form $$g(x)=(x^{2t-1}+1).p(x)$$

where $p(x)$ is a prime polynomial over $GF(2)$ with period ro, satisfying the condition $ro>(n-b)$, said device being able to correct a single error burst of a given length t and comprising:

- input means for a code word $(r(X))$;
- a first unidirectional shift register, with $(2t-1)$ stages, serially connected to said input means;
- a second unidirectional shift register, with m stages, serially connected to said input means;
- a test for zero circuit parallely connected to the $(t-1)$ highest order states of said first register;
- first modulo $(2t-1)$ counting means, able to compute the number of shifting operations performed by said first register; characterized by further comprising:
- a third unidirectional shift register with m stages, parallely connected with said second register and capable of shifting data in a direction opposed to that of the above first and second registers;
- a comparing device, parallely connected between the t lowest order stages of said first unidirectional shift register and said third shift register, the output of said comparing device being connected to second modulo ro counting means able to compute the number of shifting operations performed by said second register;
- a computing circuit connected to the outputs of said first and second counting means for computing an $(n-q)$ number able to allow, in the case, the correction of the error burst in said code word $(r(X))$.

The present invention further includes a decoding device for shortened cyclic binary code, particularly a $F(n-b,k-b>$ shortened code having a generator polynomial in the form $$g(x)-(x^{2t-1}+1).p(x)$$

where $p(x)$ being a prime polynomial over $GF(2)$ with period ro, satisfying the condition $ro>(n-b)$, said device being able to correct single error bursts of a given length t and comprising:

- input means for a code word $(r(X))$;
- a first unidirectional shift register with $(2t-1)$ stages, serially connected to said input means;
- a second shift register, with m stages, serially connected to said input means;
- a test for zero circuit parallely connected to the $(t-1))$ highest order stages of said first register;
- first modulo $(2t-1)$ counting means, able to compute the number of shifting operations performed by said first register; characterized in that
- said second shift register is a bidirectional shift register, and in that said device further comprises:
- a comparing device parallely connected between the t lowest order stages of said first unidirectional shift register and said second bidirectional shift register, the output of said comparing device being connected to second modulo ro counting means able to compute the number of shifting operations performed by said second register;
- a computing circuit connected to the outputs of said first and second counting means for computing an $(n-q)$ number able to allow, in the case, the correction of the error burst in said code word $(r(X))$.

Further evolutions of the invention are stated in the included claims.

BRIEF DESCRIPTION OF THE DRAWINGS

The present invention will now be described with more details with references to two embodiments, shown in the accompanying drawings, in which.

DETAILED DESCRIPTION OF THE PREFERRED EMBODIMENT

Figure 1:
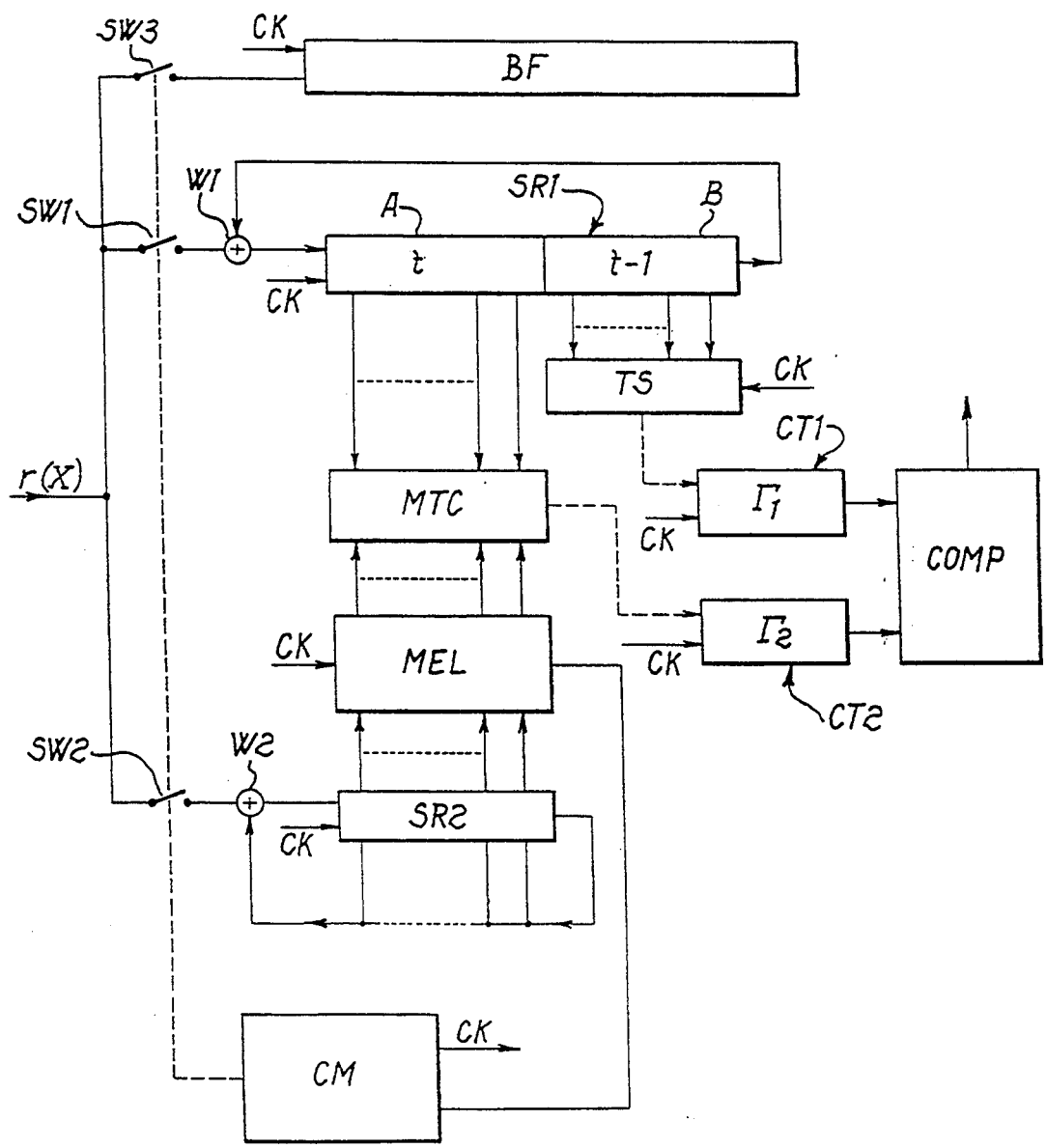
FIG. 1 shows a decoder that includes the invention.

With reference to FIG. 1, the decoder, according to the present invention includes two loop back shift registers SR1 and SR2, receiving as input the received code word r(x) and shifting data from left to right. More precisely, the SR1 register is the "Error Pattern Register", and computes the syndrome polynomial s1(x) that is the remainder of the division of the r(x) polynomial by the factor $(x^{2t-1}+1)$, while the SR2 register, called "Error Locator Register", computes the syndrome polynomial s2(x), which is the remainder of the division of the r(x) polynomial by the factor p(x).

Figure 3:
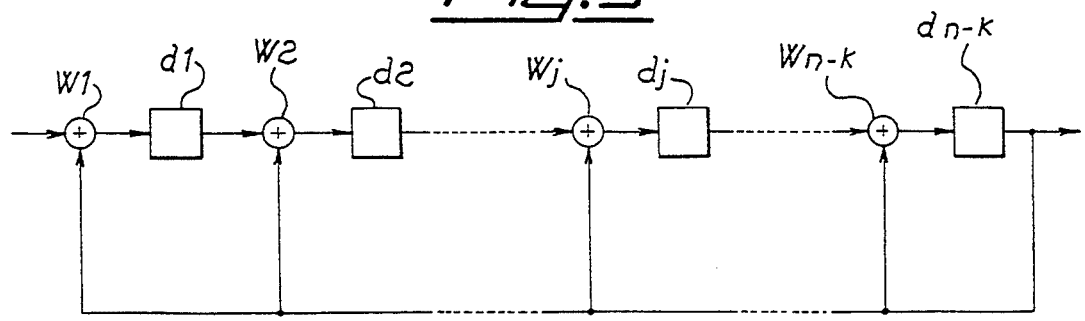
FIG. 3 schematically shows an example of a loop back shift register.

It's well known that the division of a polynomial z(x) of degree n and with coefficients in GF(2) by the polynomial g(x) of degree (n−k) and with coefficients in GF(2) is accomplished in the GF(2) field by shift registers, such as the one shown in FIG. 3, including (n−k) stages (memory cells) $d_j$ (j=1, ..., n−k), and, at most, of (n−k) exclusive-OR gates $W_j$ supplying the stage $d_j$ with the content of the highest order cell $d_{n-k}$, modulo 2 added to the content of the previous cell $d_{j-1}$.

The generic exclusive-OR gate j exists physically if the coefficient j of the polynomial g(x) is not zero. At each cycle, the content of each stage is shifted one position to the right. After n-cycles, the entire polynomial z(x) is processed, and the remainder of the division is available in the memory cells corresponding to the positions of the lowest order in the register.

Returning to FIG. 1, simplified notation is used for a generic realization, after n−b cycles need to store the code word in the buffer register BF and to compute the two syndrome polynomials s1(x) and s2(x) in the SR1 and SR2 shift registers respectively, the W1, SW2 and SW3 gates are opened, insulating the registers from the further flow of data. This is performed by the device CM for the supervision and control of the decoder. Moreover, CM also supplies the clock signal CK to the different components.

The register SR1 includes (2t−1) stages, subdivided in a part A of length t (the lower order stages). The SR2 register consists of m stages. The register BF consists of n−b stages.

By means of conventional devices that, for simplicity, are not shown in FIG. 1, it's determined if both s1(x) and s2(x) are null and, in such cased the received word r(x) is without errors and forwarded from the buffer BF to conventional decoding and reception circuits.

If only one of the polynomials is not null, this means there is an error burst longer than t, which the device is not able to correct, which has been detected. In this case the word r(x) is not decoded.

If both s1(x) and s2(x) are not null polynomials then the present invention's correction process begins.

The polynomial s1(x) is shifted rightward Γ1 times in the register SR1 until the error burst is trapped in part A of the register R1, which includes t stages. This condition is verified when the (t−1) stages in the part B of the register SR1 contain all zeros. For this purpose, part B of the register SR1 is connected in parallel with a TS circuit, which test the contents of the part B. The test circuit TS is furthermore connected to a modulo (2t−1) counting device CT1, which initially is set equal to zero, and that is increased of one unit each time a shift in SR1 is performed. If the value in the counting device CT1 is greater than (2t−2), then the presence of errors is detected and the word is not decoded.

The content of the m stages in the register SR2 is transferred in parallel in the m stages of a third shift register MEL (capable of performing a leftwards shift) whose contents are compared to the bits in the t less significant stages of SR1 in a comparing circuit MTC, connected in parallel to the t stages of part A of the register SR1. If the t stages of the lowest order of the MEL register are recognized as already containing the burst b(x) trapped in the part A of the register SR1, then Γ2=0 is set, and the computing of (n−1) is started as will be shown further on. The MTC is connected in parallel to the MEL register, which may be of a substantially similar construction to the register SR2, but with an opposite shifting direction, i.e. from right to left. In all other cases, Γ2 is set equal to (ro−1) in a modulo ro counting device CT2. A shift from left to right is performed in the MEL register until such burst b(x) is obtained in the t lowest order stages. At each new shift, Γ2 is decreased of one unit in the counter CT2, so the final value of Γ2 will be equal to (ro−k), being k the number of steps necessary to have the burst in the desired position.

If the CT2 counter reaches a value lower than (ro−N+1), then the counting of Γ2 is suspended and the presence of errors is signalled, and the word is not decoded because this means that the error burst is longer than t.

If Γ2≧(ro−N+1), the correction is performed calculating a q integer following the relation:

$$q = \Gamma 1.A1.ro + \Gamma 2.A2.(2t-1)$$

and adding modulo 2 the polynomial $x^{(n-q)}.b(x)$ to the received vector, which is present in the register BF.

According to another characteristic of the invention, the exponent (n−q) can be easily calculated starting only by Γ2 value, and more precisely, following the relation:

$$n - q = \Gamma 2 + 1 - ro$$

that can be implemented in a very simple and cheap way.

In FIG. 1, only the COMP block, connected to the output of the CT1 and CT2 counting means and that performs the calculating of (n−1), is schematically shown, because the rest of the operation is done in a conventional manner. The decoding is also performed in a conventional way, depending on the kind of coding used (systematic or not systematic) and, therefore, is not shown.

The invention is based on the fact that, given a loop back shift register capable to perform the division by the polynomial p(X) of degree m and period ro, the shifting of p positions to the right of the m components of the stored remainder polynomial is equivalent to the leftwards shifting of (ro−p) positions of the same m components when the shifting direction of all the connection of the register are inverted. Specifically, a shift to the right for p positions in the register SR2 of the components of the polynomial s2(x) is equivalent to a leftwards shift of (ro−p) positions of the components of the polynomial s2(x) in the register MEL, which is substantially similar to the register SR2, except that the shifting direction has been inverted.

The leftward shifting of the components of the polynomial s2(x) is performed so that the state corresponding to Γ2=D+1 is reached after N steps, instead of (ro−N+1)=D+1, as in Chien's device, and having assumed N<ro/2, this means a lower number of cycles. As we pointed out, is Γ2≧D+1, and N is the maximum number of cycles required to obtain the burst b(x) in the t lower order stages in the register MEL.

Specifically, the device according to the present invention allows the correction to be performed in (n−b−1)+(2t−1) cycles maximum, i.e., for the already mentioned F(224,182), in 224 cycles maximum, instead of the 130848 cycles expected according to the already known technique.

Figure 2:
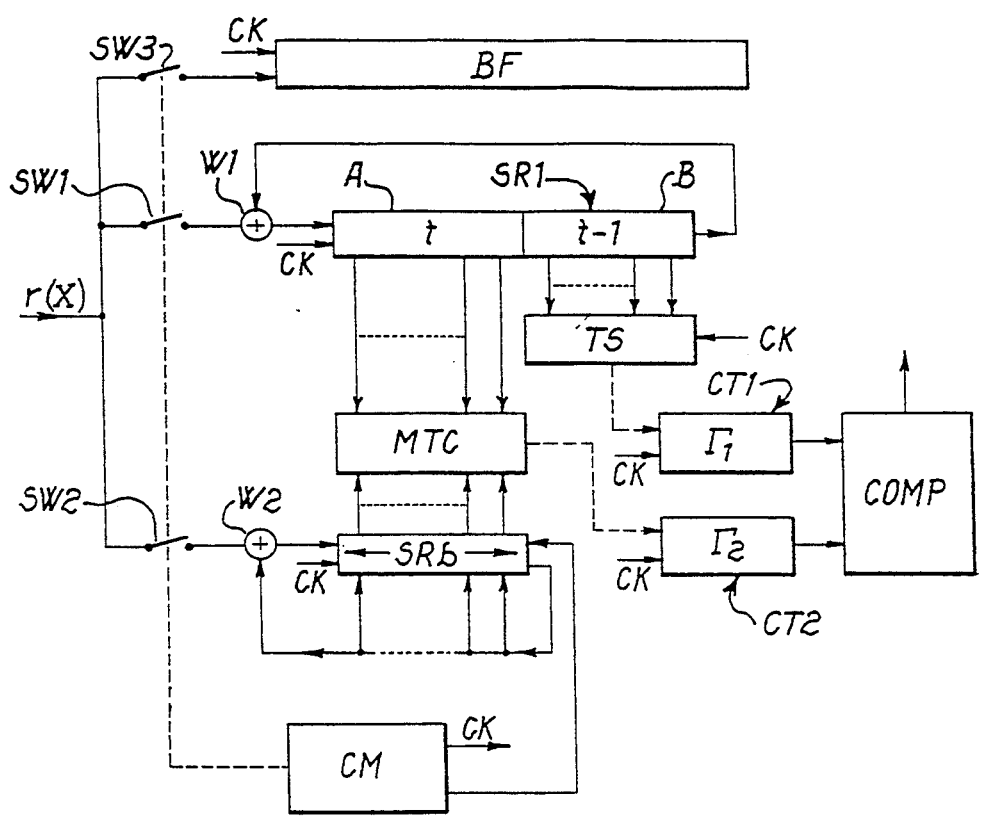
FIG. 2 shows a possible variation of the decoder according to the invention.

FIG. 2 shows a further application of the decoder according to the invention, where the SRb register shifts in both directions and, therefore, no extra register to perform the leftward shifting is needed. The circuit's operation is similar to the circuit in FIG. 1, and is not further described. Further, in the circuit of FIG. 2, the same reference labels have been used to describe the same or equivalent parts as the ones in FIG. 1.

According to the present invention, it is therefore possible to obtain a reduction of the amount of cycles needed to correct error bursts, particularly when (n−b)<<ro, which is frequent.

The invention allows the advantageous use of shortened Fire codes in digital transmission systems, on memory channels, such as, for example, a digital mobile radio system.

I claim:

1. A method of decoding a shortened cyclic binary code, for correcting a single error burst b(x) of a length t or shorter said cyclic binary code having generator polynomial of type $g(x)=(x^{2t-1}+1).p(x)$, wherein p(x) is a prime polynomial over GF(2) with period ro, satisfying ro>(n−b), where n equals a length of a binary code and b equals a number of shortened bits, comprising the steps of:
   (a) buffering a received code word r(x) in a first shift register as a received vector and calculating syndrome polynomials s1(x) and s2(x) in (n−b) cycles;
   (b) cyclic shifting the syndrome polynomial s1(x) in a second shift register Γ1 number of times in a first direction until all zeros are obtained in (t−1) higher order positions, in order to trap the single error burst b(x) of length t in lower order positions;
   (c) cyclic shifting the syndrome polynomial s2(x) in a third shift register, in an opposite direction of the syndrome polynomial s1(t), until a pattern of a lower order t bits is the same as said single error burst b(x) of length t, and determining Γ2 equal to (ro−h), where h is a number of shifting operations performed;
   (d) calculating (n−q) by: q=Γ1.A2.ro+Γ2.A1.(2t−1) mod(n) where A1 and A2 are two positive integers such that: A1.(2t−1)+A2.ro=1; and
   (e) correcting the single error burst in a correcting circuit by adding modulo 2, a polynomial $(x^{n-q}).b(x)$ to a received vector.

2. The method of claim 1, wherein (n−b)<ro/2.

3. The method of claim 1 or 2, wherein ro and (2t−1) are prime to each other.

4. The method of claim 3, wherein if Γ2 is less than ro−(n−b)−1, the single error burst is greater than t and said method is terminated.

5. The method of claim 4, wherein if the pattern of the lower order t bits in step (c) are the same as said single error burst of length t with no shifting of the syndrome polynomial s2(x), then Γ2 is set equal to zero and (n−q)=0.

6. The method of claim 1, wherein the shortened cyclic binary code is a F(n−b,k−b) shortened Fire code, wherein k equals a number of information bits in a code word.

7. The method of claim 1 wherein no error is contained in the received code word if both the s1(x) and s2(x) syndrome polynomials are null, wherein the error is contained in the received code word if only one of the s1(x) and s2(x) syndrome polynomials are null, and wherein the error is contained in the received code word and corrected and decoded if both the s1(x) and s2(x) syndrome polynomials are not null.

8. A method of decoding a shortened cyclic binary code, for correcting a single error burst b(x) of a length t or shorter said cyclic binary code having generator polynomial of type $g(x)=(x^{2t-1}+1).p(x)$, wherein p(x) is a prime polynomial over GF(2) and with period ro, where Γ2 equal to (ro−h) is calculated by cyclic shifting in a shift register, with h equal to a number of shifting operations required to obtain the single error burst b(x) in t least significant positions of a syndrome polynomial s2(x), said method comprising the steps of:
   calculating (n−q) wherein:
   (n−q)=Γ2+1−ro; and
   correcting the single error burst in a correcting circuit by adding modulo 2 a polynomial $(x^{n-q}).b(x)$ to a received vector.

9. The method of claim 8, wherein
   ro>(n−b)
   where n equals a length of a binary code and b equals a number of shortened bits.

10. The method of claim 8, wherein the shortened cyclic binary code is a F(n−b,k−b) shortened Fire code, wherein k equals a number of information bits in a code word.

11. A decoding device for a shortened cyclic binary code having a generator polynomial of type $$g(x)=(x^{2t-1}+1).p(x)$$

where p(x) is a prime polynomial over GF(2) with period ro, satisfying ro>(n−b) where n equals a length of a binary code and b equals a number of shortened bits for correcting single error bursts of a given length t and comprising:
   input means for receiving a code word (r(X));
   a first unidirectional shift register, with (2t−1) stages, serially connected to said input means;
   a second unidirectional shift register, with m stages, serially connected to said input means, said first and second unidirectional shift registers receiving as input the code word (r(X));

a test for zero circuit, parallely connected to (t−1) highest order stages of said first unidirectional shift register;

first modulo (2t−1) counting means, for computing a number of shifting operations performed by said first unidirectional shift register;

a third unidirectional shift register with m stages, parallely connected with said second unidirectional shift register for shifting data in a direction opposite to said first and second unidirectional shift registers;

a comparing device, parallely connected between the t lowest order stages of said first unidirectional shift register and said third unidirectional shift register, wherein an output of said comparing device is provided to second modulo ro counting means for computing a number of shifting operations performed by said second unidirectional shift register; and a computing circuit connected to outputs of said first modulo (2t−1) and second modulo ro counting means for correcting the single error burst in the code word (r(X)).

12. The device of claim 11, wherein the shortened cyclic binary code is a F(n−b,k−b) shortened Fire code, wherein k equals a number of information bits in a code word.

13. The digital decoding device of claim 11, wherein no error is contained in the received code word if both the first and second syndrome polynomials are null, wherein the error is contained in the received code word if only one of the first and second syndrome polynomials is null, and the error is contained in the received code word and corrected and decoded if both the first and second syndrome polynomials are not null.

14. A decoding device for a shortened cyclic binary code having a generator polynomial of type $$g(x) = (x^{2t-1} + 1) \cdot p(x)$$

where p(x) is a prime polynomial over GF(2) with period ro, satisfying ro > (n−b) where n equals a length of binary code and b equals a number of shortened bits for correcting single error bursts of a given length t or shorter, comprising:

input means for receiving a code word (r(X));

a first unidirectional shift register with (2t−1) stages, serially connected to said input means;

a second bidirectional shift register, with m stage, serially connected to said input means, said first and second shift registers receiving as input the code word (r(X));

a test for zero circuit parallely connected to (t−1) highest order stages of said first unidirectional shift register;

first modulo (2t−1) counting means for computing a number of shifting operations performed by said first unidirectional shift register;

a comparing device parallely connected between the t lowest order stages of said first unidirectional shift register and said second bidirectional shift register, where an output of said comparing device is provided to second modulo ro counting means for computing a number of shifting operations performed by said second bidirectional shift register; and a computing circuit connected to outputs of said first modulo (2t−1) and second modulo ro counting means for correcting the single error burst in the code word (r(X)).

15. The decoding device of claim 11 or 14, further comprising an (n−b) stage buffer register serially connected to said input means.

16. The device of claim 14, wherein the shortened cyclic binary code is a F(n−b,k−b) shortened Fire code, wherein k equals a number of information bits in a code word.

* * * * *